United States Patent
Lang et al.

(10) Patent No.: US 10,700,251 B2
(45) Date of Patent: Jun. 30, 2020

(54) LED MODULE WITH A STABILIZED LEADFRAME

(71) Applicant: LEDVANCE GmbH, Garching bei Munchen (DE)

(72) Inventors: Heinz Lang, Schernfeld (DE); Georg Rosenbauer, Wassertruingen (DE)

(73) Assignee: LEDVANCE GMBH, Garching Bei Munchen (DE)

( * ) Notice: Subject to any disclaimer, the term of this patent is extended or adjusted under 35 U.S.C. 154(b) by 0 days.

(21) Appl. No.: 16/229,627

(22) Filed: Dec. 21, 2018

(65) Prior Publication Data

US 2019/0198736 A1    Jun. 27, 2019

(30) Foreign Application Priority Data

Dec. 22, 2017  (DE) .................. 10 2017 131 063

(51) Int. Cl.
| | |
|---|---|
| *H01L 33/62* | (2010.01) |
| *H01L 21/48* | (2006.01) |
| *H01L 33/64* | (2010.01) |
| *F21K 9/278* | (2016.01) |
| *F21V 29/503* | (2015.01) |
| *F21V 23/00* | (2015.01) |
| *F21V 19/00* | (2006.01) |
| *H01L 25/075* | (2006.01) |
| *F21K 9/27* | (2016.01) |
| *F21Y 115/10* | (2016.01) |
| *F21Y 103/10* | (2016.01) |
| *F21V 23/06* | (2006.01) |
| *H05K 3/20* | (2006.01) |

(Continued)

(52) U.S. Cl.
CPC ............ *H01L 33/62* (2013.01); *F21K 9/27* (2016.08); *F21K 9/278* (2016.08); *F21V 19/005* (2013.01); *F21V 23/006* (2013.01); *F21V 29/503* (2015.01); *H01L 21/4828* (2013.01); *H01L 21/4842* (2013.01); *H01L 25/0753* (2013.01); *F21K 9/232* (2016.08); *F21K 9/90* (2013.01); *F21V 23/005* (2013.01); *F21V 23/06* (2013.01); *F21Y 2103/10* (2016.08); *F21Y 2115/10* (2016.08); *H01L 33/647* (2013.01); *H01L 2933/0066* (2013.01); *H05K 3/202* (2013.01)

(58) Field of Classification Search
CPC .............. H01L 33/62; H01L 25/0753; H01L 23/49575; H01L 23/49582; H01L 23/49586; H01L 23/49894
See application file for complete search history.

(56) References Cited

U.S. PATENT DOCUMENTS

2015/0362136 A1*  12/2015  Bancken ................. F21K 9/90
                                                          362/294
2017/0170366 A1*  6/2017   Fukuda ............. H01L 23/49575

FOREIGN PATENT DOCUMENTS

DE        10014804 A1    9/2001

* cited by examiner

*Primary Examiner* — Changhyun Yi
(74) *Attorney, Agent, or Firm* — Hayes Soloway PC

(57) ABSTRACT

A LED module for use in a LED light, preferably a LED retrofit lamp, has a leadframe and one or more LEDs which are electrically and mechanically connected to the leadframe. The LED module has one or more stabilizing sections made from an insulating material which are introduced locally, preferably in a punctiform and/or linear manner, into intermediate spaces of the leadframe in order to fasten sections of the leadframe to one another and, preferably, to space them apart from one another.

21 Claims, 11 Drawing Sheets

(51) Int. Cl.
*F21K 9/90* (2016.01)
*F21K 9/232* (2016.01)

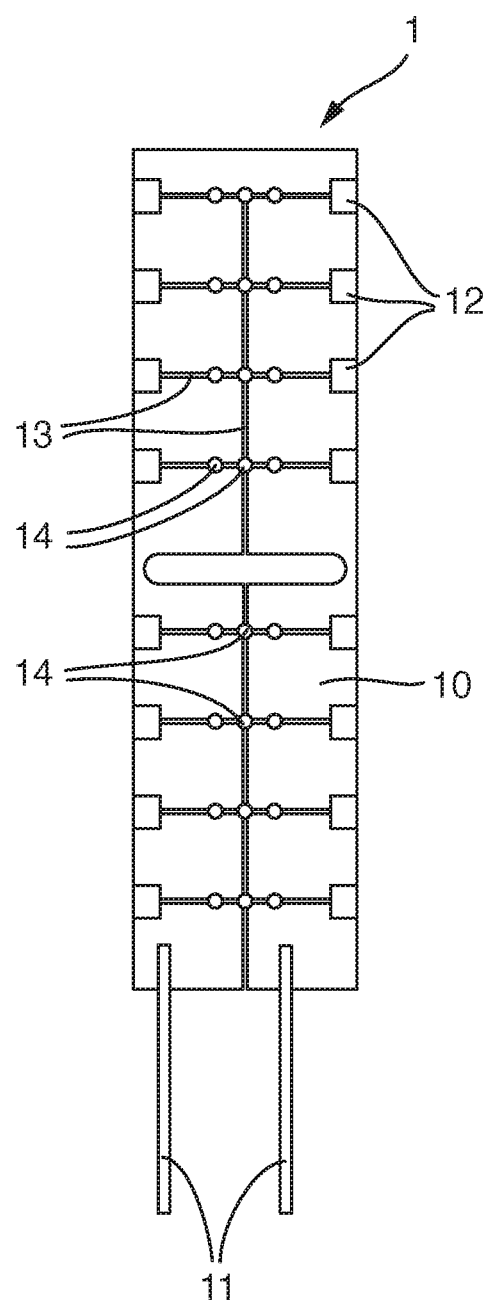
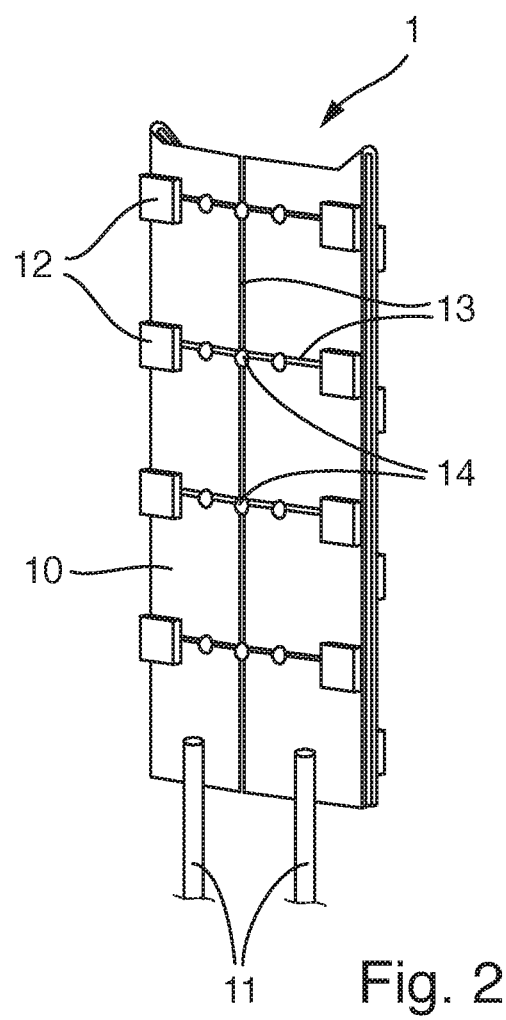
Fig. 2a
Fig. 2b

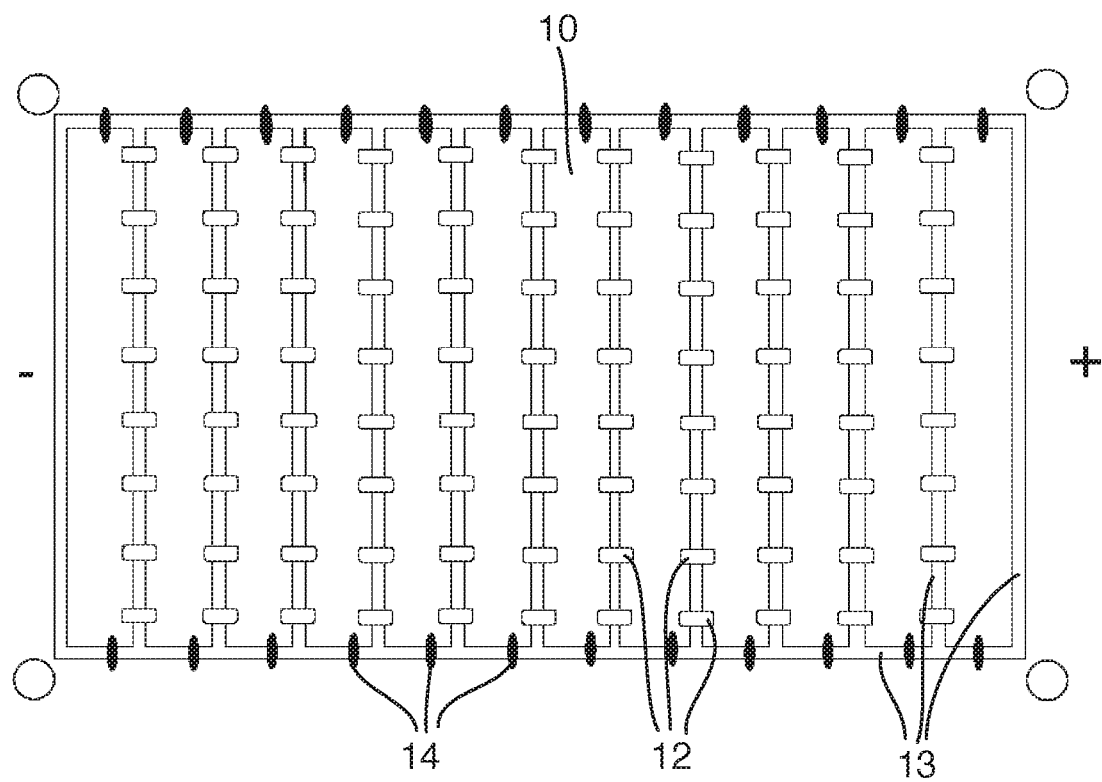
Fig. 9c
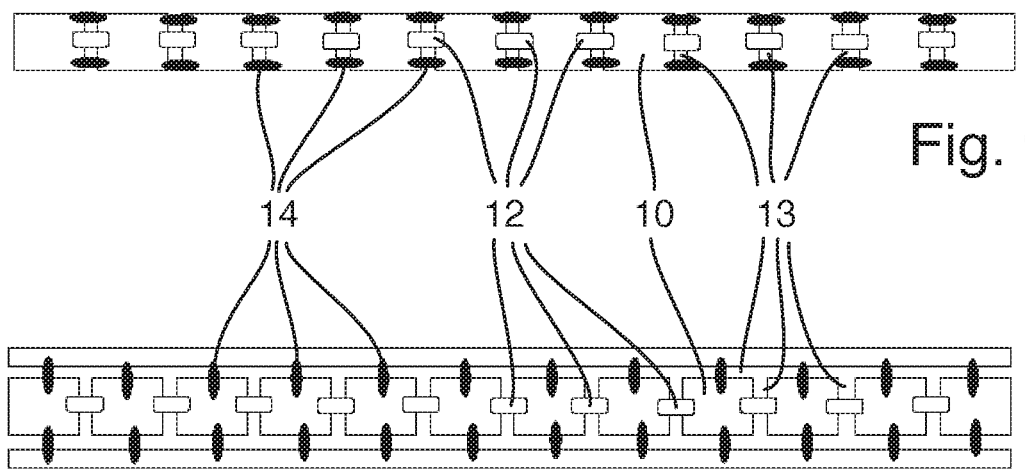
Fig. 9d
Fig. 9e

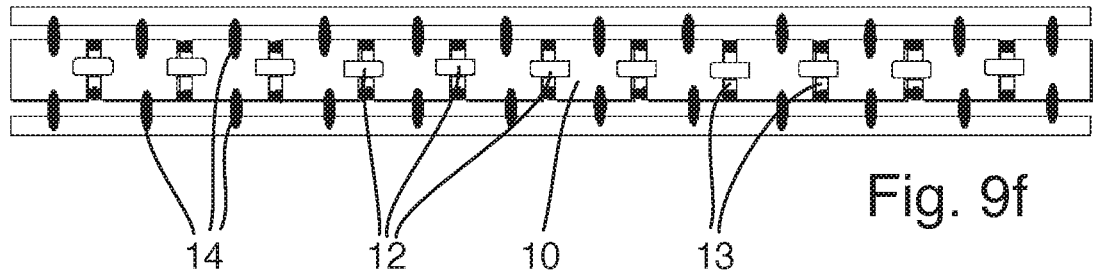
Fig. 9f
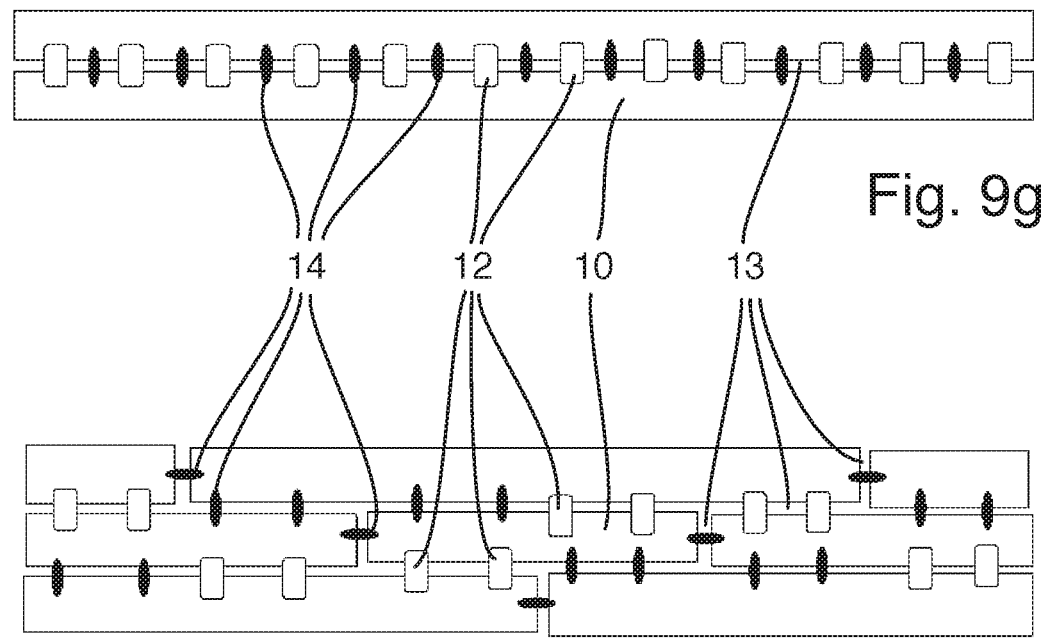
Fig. 9g
Fig. 9h

LED MODULE WITH A STABILIZED LEADFRAME

CROSS-REFERENCE TO RELATED APPLICATIONS AND PRIORITY

This patent application claims priority from German Patent Application No. 102017131063.0 filed Dec. 22, 2017, which is herein incorporated by reference in its entirety.

TECHNICAL FIELD

The present invention relates to a LED module for use in a LED light, for example a LED retrofit lamp, as well as a method for producing such a LED module. The LED module has a leadframe and one or more LEDs which are electrically and mechanically connected to the leadframe.

BACKGROUND

LED lights are known which use stamped sheets (also designated as "metal stampings" or "leadframes"), for connection and for mounting the LEDs.

DE 100 14 804 A1 describes a light module having two conductive tracks which are stamped out of a sheet and are encapsulated by a substrate material made of plastic. The conductive tracks and the substrate material together form a substrate for a plurality of series-connected LEDs. For production of the substrate, the conductive tracks are stamped out from a sheet, wherein transport strips and connection bars for stabilization of the stamped sheet remain for further processing. The transport strips and connection bars are removed at a later time. After the stamping operation, the conductive tracks are encapsulated with a plastic that serves as substrate material in order to produce a permanent mechanical connection between the conductive tracks. In this case the side of the conductive tracks to be equipped with the LEDs remains free of plastic. The fastening of the LEDs takes place by a SMD soldering technique (SMD stands for "surface-mounted device"), in which the conductive tracks are provided with a soldering paste, then equipped with the LEDs and finally are heated by infrared radiation from a melting furnace so that the soldering paste melts. In this way LEDs are connected to the conductive tracks.

In order to carry out the method described above, an injection molding machine is necessary in order to encapsulate the conductive tracks with a plastic to produce the substrate. This is technically complex, expensive and moreover necessitates a very large quantity of plastic, which moreover must meet high thermal requirements during the soldering process. For this purpose the DE 100 14 804 A1 uses resilient plastic in order to enable a certain adaptability of the light module to different forms of lights. Nevertheless, the bending properties and thus the flexibility of the light module is restricted due to the substrate material.

SUMMARY

An object of the invention consists of solving one or more of the above-mentioned technical problems, in particular a LED module for use in a LED light, preferably a LED retrofit lamp, and providing a method for producing such a LED module in a technically simple but nevertheless reliable and stable manner to enable a high geometric adaptability to the LED light.

This object is achieved by a LED module with the features according to claim 1 as well as a method with the features according to claim 10. Advantageous further embodiments follow from the subordinate claims, the following description of the invention as well as the description of preferred exemplary embodiments.

The LED module according to the invention is configured for use in a LED light. In this case the LED light is preferably a so-called LED retrofit lamp, for instance in the external shape of a conventional light bulb with an Edison base, which is designed for use in conventional sockets or in pin contact sockets, such as for example reflector lamps for GU10, pin-base lamps for G4 or G9 or fluorescent tubes for G13 sockets. For this purpose, the LED light preferably has a LED driver which converts the mains voltage provided by the socket into an appropriate form for the LEDs.

The LED module according to the invention has a leadframe which is a metallic leadframe. The metallic leadframe is, for example, stamped out, cut out or etched out of a sheet. The leadframe, so long as it is not or not yet bent, is a flat structure which has two opposing surfaces extending substantially parallel and spaced apart by the sheet thickness. The leadframe can be manufactured, for example, from a cost-effective material, such as for instance steel, or a material with high thermal conductivity, such as for instance copper, or a metal with an optically high grade appearance, such as for instance brass. The sheet thickness is preferably in the range from 0.1 mm to 2 mm, more preferably in the range from 0.2 mm to 0.8 mm. In particular materials which can be used for printed circuit boards (PCBs) are suitable. Moreover, the leadframe can be coated for example with a Sn, Zn, Au, Ag, Pt, Pd or Ni layer, and/or the surfaces of the leadframes can be partially or completely roughened. In particular, part-regions of the leadframes can be provided with a light-reflecting, for example white, coating. The LED module has, for fastening and for electrical connection in a LED light, connectors which can be, for example, integral or one-piece sections of the leadframe or conductors which are soldered to the leadframe. By any integration of spring contacts into the leadframe it is possible optionally to save on SMD spring contact elements or connecting plugs.

Furthermore, according to the invention the LED module has one or more LEDs which are electrically and mechanically connected to the leadframe. The LEDs are preferably soldered, for example, onto connection points of the leadframe, for example by means of a SMD process. The LEDs can be designed as one-piece semiconductor components or also as multi-part components.

Furthermore, according to the invention the LED module has one or more stabilizing sections made from an insulating material which are introduced locally, preferably in a punctiform and/or linear manner, into intermediate spaces of the leadframe in order to fasten sections of the leadframe to one another and preferably to space them apart from one another.

In this connection "locally" means, in particular, that the leadframe is not completely or substantially embedded in a housing or a shell, for instance made from plastic. The stabilizing sections are characterized in that they are provided locally at points on the leadframe at which a stabilization and optionally a spacing is necessary in order to ensure the mechanical and electrical functionality of the LED module. Thus the stabilizing sections can be provided in particular in spaces, for instance gaps, so as to prevent an inadvertent bending together and contacting of sections of the leadframe which are to be insulated electrically.

The stabilizing sections are preferably manufactured from polymer and/or glass and/or ceramic and/or cement and/or SMD components with insulating properties. SMD components with insulating properties also comprise: resistors with an extremely high resistance in the mega- or giga-ohm range, diodes in the locking direction, condensers in direct current applications or the like. Epoxy resin glue has proved to be advantageous as a polymer, of which the coefficient of linear thermal expansion (CTE) is in the same order of magnitude as any polymer housing of the LED and thus, in the event of changing temperature load, causes no thermal stresses on the LED. Alternatively or in addition, other polymers may also be considered, such as for instance thermoplastics, for example PC, PMMA, PBT, thermosetting plastics or elastomers, such as for example silicones.

The LED module as constructed functions without a housing and without a plastic substrate in which the leadframe is completely or substantially embedded. It is not necessary to provide an injection molding machine and a method step of encapsulation of the leadframe with a substrate material, whereby the production effort, in particular costs and time, is reduced. No costs are incurred for the production of plastic molding tools. Moreover, since the LED module uses the leadframe without a substrate, it is particularly flexible, three-dimensionally malleable and thus can be used flexibly for different LED lights. Furthermore, as a result the light emission characteristic of the LED module can be set in particularly varied ways. Moreover, due to the thermal conductivity of the metal leadframe and the open construction of the LED module a buildup of heat is effectively prevented, so that in some embodiments special measures for heat dissipation can be omitted. Also, in visually aesthetic terms, the metal leadframe/printed circuit board appears superior to, for instance, conventional printed circuit boards made of FR4. In specific LED lights the printed circuit board can be used as a visual attraction. Moreover, the open construction without a housing or substrate enables the engraving or etching of signs, for instance QR codes or lamp designations, by means of laser engraving or a photochemical etching process, so that the visual appearance of the LED module can be adapted flexibly.

The two surfaces of the leadframe preferably substantially have no contact with material of the stabilizing sections. "Substantially" means that more than half, preferably more than 80%, of both surfaces (considered individually) is not in contact with stabilizing sections. Preferably both surfaces (considered individually) of the leadframe are (in the sense defined above) uncovered, i.e. moreover they also have no contact with LEDs, SMD components, solder points etc. As a result, the flexibility described above can be further improved and the manufacturing effort can be further reduced.

For the same reasons the individual stabilizing sections are preferably distinguishable, i.e. they do not overlap to form a structure in the order of magnitude of the leadframe. Accordingly, the expansion of the individual stabilizing sections preferably corresponds to only a small part of the overall expansion of the leadframe. In particular, the leadframe preferably has electrically insulating intermediate spaces, for instance gaps or gap sections, which are not filled and thus completely penetrate the leadframe in the direction of the thickness. The expansion of the stabilizing section preferably corresponds substantially to the order of magnitude of the intermediate spaces to be bridged.

The leadframe is preferably provided completely or partially with a white light-reflecting coating, wherein in this case one, a plurality of or all of the LEDs can be covered or masked.

The leadframe is preferably at least partially bent, so that on the one hand the light emission characteristic of the LED module can be adapted in a simple manner and on the other hand the LED module can be brought into a suitable three-dimensional geometry for a LED light. The leadframe is preferably bent by 180° along a line, so that a light emission on both sides can be achieved without the need to equip the leadframe on both sides. This simplifies the production process. Moreover, in this way the cooling effect can be improved, since the heat produced by the LEDs can be dissipated from a larger leadframe surface.

If two sections of the leadframe are bent towards one another in this way, they are preferably spaced apart and optionally connected by one or more of the stabilizing sections, so that an electrical contact between the two sections is prevented. Thus the relevant stabilizing sections are used synergistically as spacers between the leadframe sections which are bent towards one another. Alternatively or in addition, spacers made from an insulating material, for instance a plastic, can be attached to the leadframe. Moreover, if insulating magnets are used as spacers, the bent leadframe sections can be fixed in a simple and original manner.

The leadframe is preferably equipped on both sides with LEDs, i.e. LEDs are located on both surfaces of the leadframe, so that the LED module can be particularly compact and saves on material. In addition, the LED module has advantageous thermal characteristics, so that it is particularly cost-effective and reliable by comparison with a conventional circuit board material which can be equipped on two sides, for example FR4, Metal Core PCB MCPCB.

The LEDs are preferably arranged like a lattice. In other words, the LEDs form a two-dimensional or three-dimensional lattice, thus achieving further flexibility of the geometries which can be produced for the LED module. The LEDs, in particular all LEDs of the lattice, are preferably connected in series by the leadframe. In specific embodiments, however, parallel connections and mixtures of parallel and series connection are possible.

The method according to the invention for producing a LED module according to the above description comprises: stamping out or chemical etching out or cutting out of the leadframe from a sheet, wherein preferably connection bars and/or transport sections which are not part of the finished LED module are left to stand temporarily; equipping the leadframe with LEDs by connecting the LEDs electrically and mechanically to the leadframe, preferably by soldering; stabilizing the leadframe by local introduction of an insulating material, preferably polymer and/or glass and/or ceramic and/or insulating SMD components, into intermediate spaces of the leadframe, so that the stabilizing sections are formed.

The specification of the above process steps does not define any order. Thus for example the leadframe can be equipped with LEDs both before and also after the stabilization step. It is also possible to do this simultaneously, in particular in the case in which the insulating stabilization is carried out by means of SMD components.

Encapsulation of the leadframe is preferably omitted such that a housing or plastic substrate is formed which completely or substantially embeds the leadframe.

One or both surfaces of the leadframe are preferably at least partially roughened and/or coated, preferably with a Sn, Zn, Au, Ag, Pd, Pt or Ni layer. In addition to protection of the leadframe against any external effects the heat emission factor can be increased by this. This leads to a temperature drop on the LEDs, so that impairment of the light emission characteristic of the LEDs is prevented and the durability is improved.

The leadframe is preferably provided completely or partially with a light-reflecting, for example white, coating.

The leadframe is preferably bent at least partially, for instance after the leadframe is equipped with LEDs and after the stabilization by introduction of the stabilizing sections.

The technical effects, preferred embodiments and contributions to the prior art which have been described in relation to the LED module apply analogously to the production method.

Further advantages and features of the present invention are disclosed by the following description of the drawings. The features described there can be implemented singly or in combination with one or more of the features described above, in so far as the features do not conflict. The following description of the drawings is given with reference to the accompanying drawings.

BRIEF DESCRIPTION OF THE DRAWINGS

FIGS. 2a and 2b show a LED module according to a further exemplary embodiment, wherein the LED module is shown before (FIG. 2a) and after (FIG. 2b) a bending operation of the leadframe.

FIGS. 5b and 5c show different bending and fitting configurations.

FIGS. 6a and 6b show a semi-finished product during manufacture and FIG. 6c shows the complete LED module.

FIGS. 9a to 9h show leadframe geometries of different exemplary embodiments.

DETAILED DESCRIPTION OF THE DRAWINGS

Figure 1A:
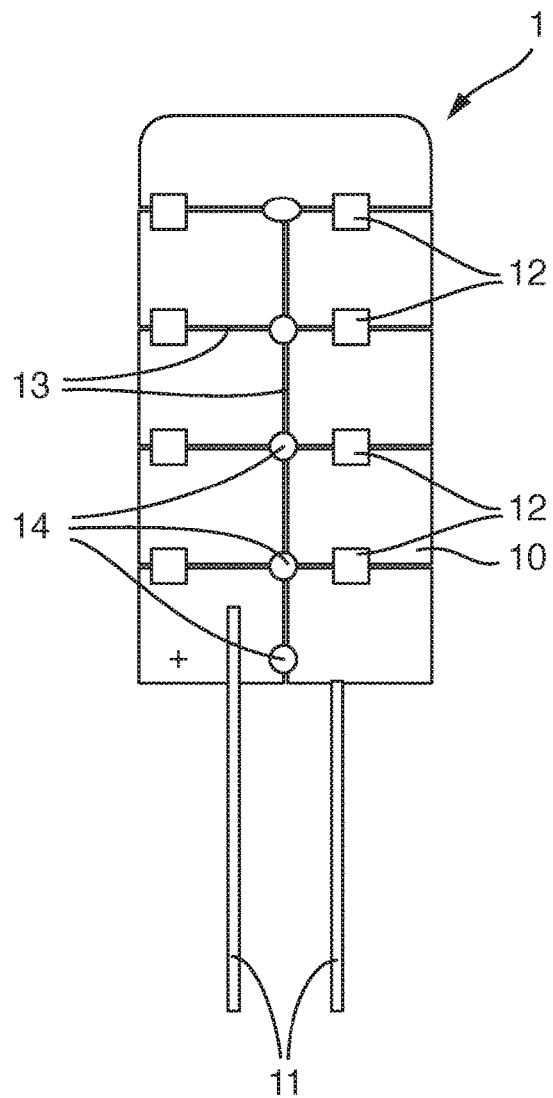
FIGS. 1a and 1b show a LED module from the front (FIG. 1a) and from the rear (FIG. 1b) with a stabilized leadframe which is equipped with a plurality of LEDs.

The drawing descriptions are described below with reference to the drawings. In this case elements which are the same, similar, or act in the same way are provided with identical reference numerals in the different drawings, and repeated description of some of these elements is omitted in order to avoid redundancies.

Figure 1B:
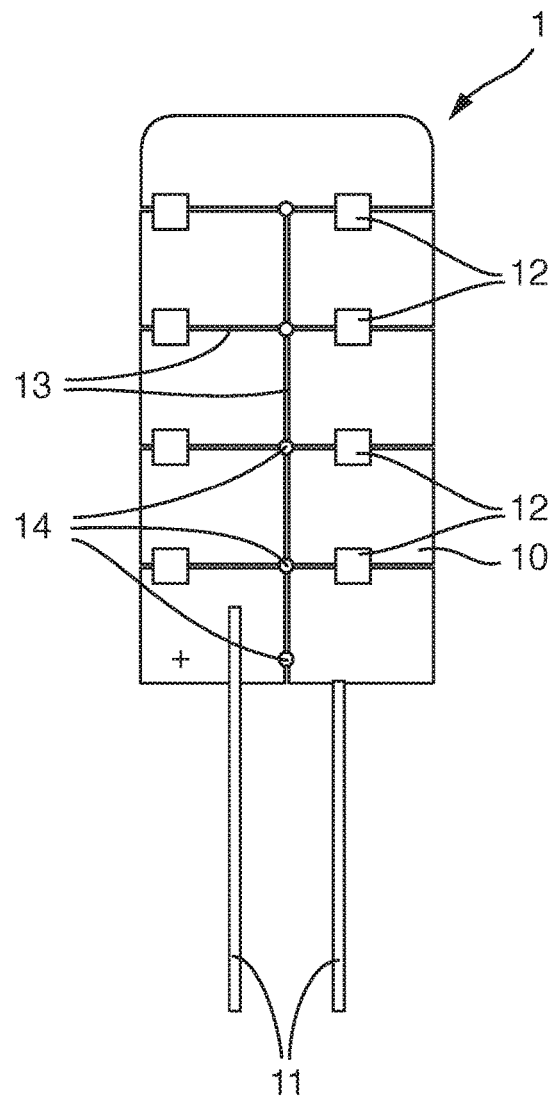

FIG. 1a shows a LED module 1 according to a first exemplary embodiment, considered from one side which may be designated here as the "front side". FIG. 1b shows the LED module 1 from the opposite side, i.e. the "rear side".

The LED module 1 has a leadframe 10, which is a metallic lead frame stamped out or cut out of a sheet. The leadframe 10 can be manufactured for example from a cost-effective material, such as for instance steel, or a material with high thermal conductivity, such as for instance copper. In particular materials which can be used for printed circuit boards (PCBs) are suitable. If a magnetic material is used, for instance magnetic steel, the connection of the LED module 1 and the optical adjustment can be simplified. Moreover, the leadframe 10 can be coated for example with a Sn or Ni layer. Connectors 11 are soldered onto the leadframe 10 or are integral components of the leadframe, for fastening and for electric connection in a light (cf. FIGS. 7a to 7c).

The leadframe 10 forms conductive tracks which in the present example of FIGS. 1a and 1b enable a series connection of a plurality of LEDs 12. For this purpose, the LEDs 12 are mounted by means of a SMD process on corresponding connection points on the leadframe 10. Since the LEDs 12 in each case bridge an insulating intermediate space 13 of the leadframe 10, the LEDs 12 contribute to a stabilization of the leadframe 10.

For further and definitive stabilization of the leadframe 10 punctiform or linear stabilizing sections 14 are provided, which are made from an insulating material—for example polymer, glass, cement, ceramic or insulating SMD components—and bridge one or more intermediate spaces 13 which in this case are gaps. The stabilizing sections 14 are introduced at least in part into intermediate spaces 13, in order to stabilize the corresponding sections of the leadframe 10 and to space them apart from one another. The stabilizing sections 14 are characterized in that they are provided locally at points on the leadframe 10 at which a spacing and stabilization is necessary in order to ensure the mechanical and electrical functionality of the LED module 1. Thus the stabilizing sections 14 are provided in particular in spaces 13 so as to prevent an inadvertent bending together and contacting of sections of the leadframe 10 which are to be insulated electrically.

The LED module 1 thus constructed functions without a stabilizing housing and without a plastic substrate in which the leadframe 10 is completely or substantially embedded. In particular it is not necessary to provide an injection molding machine and a method step of encapsulation of the leadframe 10 with a substrate material. Moreover, since the LED module 1 uses the leadframe 10 without a substrate, it is particularly flexible, three-dimensionally malleable and thus can be used flexibly for different LED lights. The production process is simplified by comparison with a LED module with a plastic substrate, and the production costs as well as the product costs are reduced. Moreover, due to the high thermal conductivity of the leadframe 10 and the open construction of the LED module 1 a buildup of heat is effectively prevented, so that in some variants special measures for heat dissipation can be omitted.

The leadframe 10 can be equipped with LEDs 12 on one side or on both sides.

According to an exemplary embodiment which is shown in FIGS. 2a and 2b, light emission can also be achieved on both sides in that the stamped-out or cut-out, equipped and stabilized leadframe 10 (FIG. 2a) is bent, as shown in FIG. 2b. In such cases one or more of the stabilizing sections 14 can be used synergistically as spacers between the leadframe sections which are bent towards one another. Alternatively or in addition, spacers made from an insulating material, for instance a plastic, can be attached to the leadframe 10.

Moreover, if insulating magnets are used as spacers, the bent leadframe sections can be fixed to one another in a simple and original manner.

Since the leadframe 10 is bent in a manufacturing step, the light emission characteristic can be adapted in a simple manner. In particular a light emission on both sides can be achieved according to the exemplary embodiment of FIG.

2b, without the need to equip the leadframe on both sides. This simplifies the production process. Moreover, in this way the cooling effect can be improved, since the heat produced by the LEDs can be dissipated from a larger leadframe surface.

Figure 3:
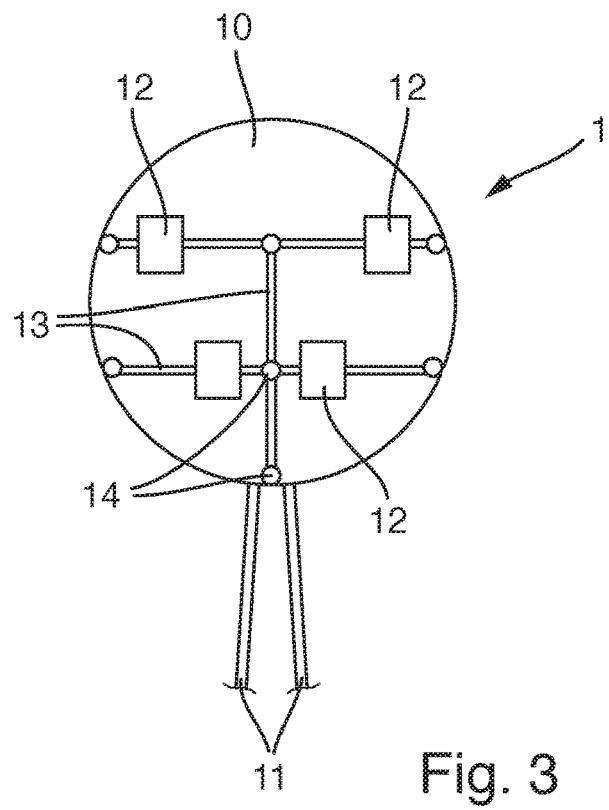
FIG. 3 shows a LED module according to a further exemplary embodiment.
Figure 4:
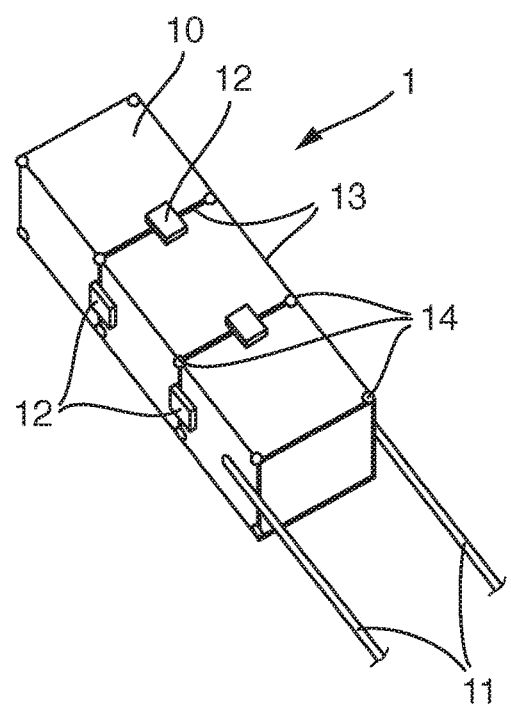
FIG. 4 shows a LED module according to a further exemplary embodiment.

FIG. 3 shows a LED module 1 according to a further exemplary embodiment, in which the leadframe 10 has a planar circular form. A three-dimensional form of a leadframe 10, which is achieved by bending of sections of the leadframe sheet, is disclosed in the exemplary embodiment according to the FIG. 4.

Figure 5A:
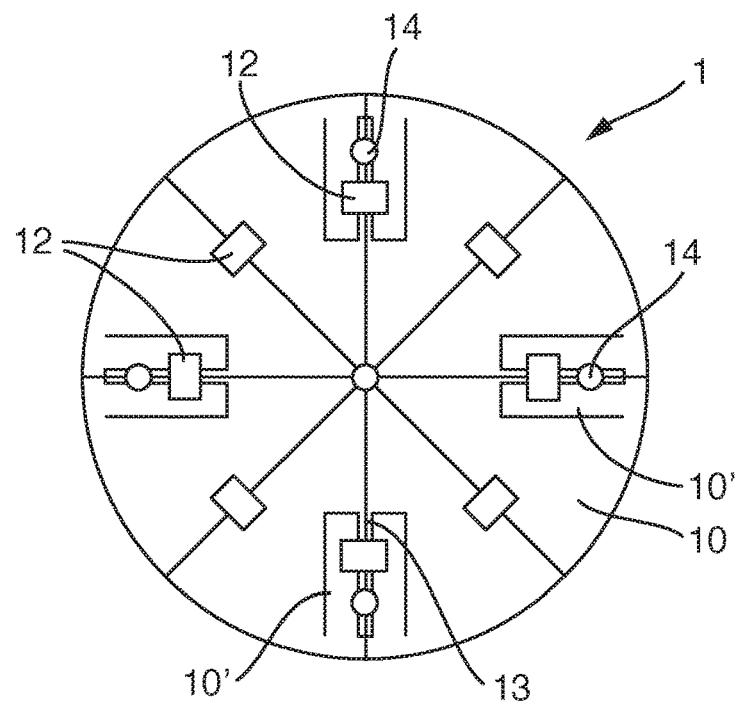
FIGS. 5a to 5c show a LED module according to a further exemplary embodiment, wherein the partial
Figure 5B:
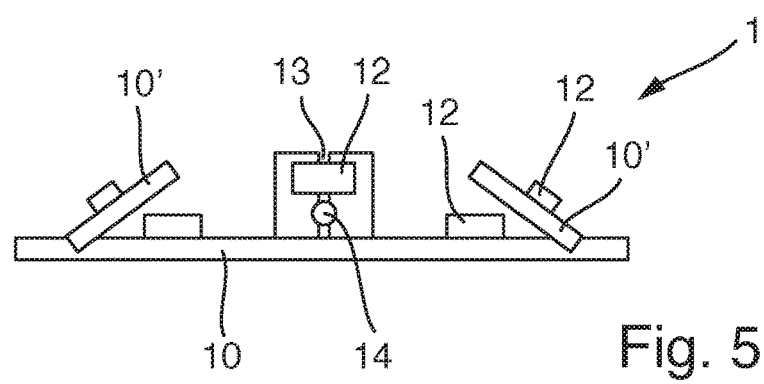
Figure 5C:
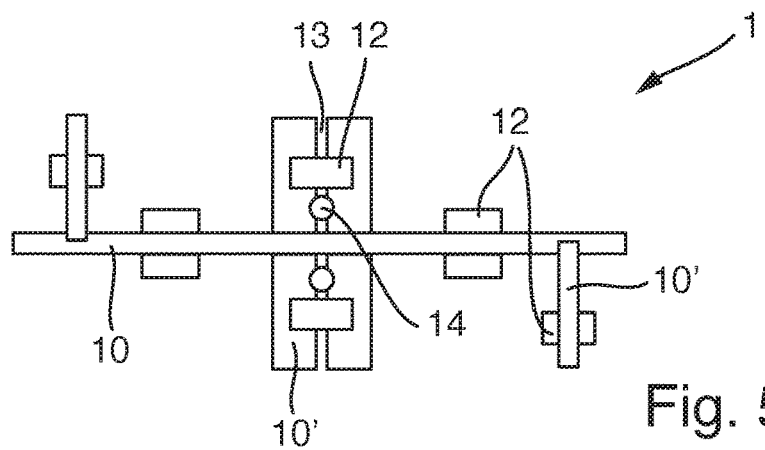

FIG. 5a shows a LED module 1 according to a further exemplary embodiment which has a leadframe 10 with stamped-out or cut-out lead frame sections 10'. The leadframe sections 10' can be bent individually, so that a flexible light emission characteristic can be achieved. In particular the basic shape of FIG. 5a can be bent in a different manner and equipped with LEDs 12, as shown in FIGS. 5b and 5c, so that a flexibly adjustable light distribution can be achieved in a simple manner.

Figure 6A:
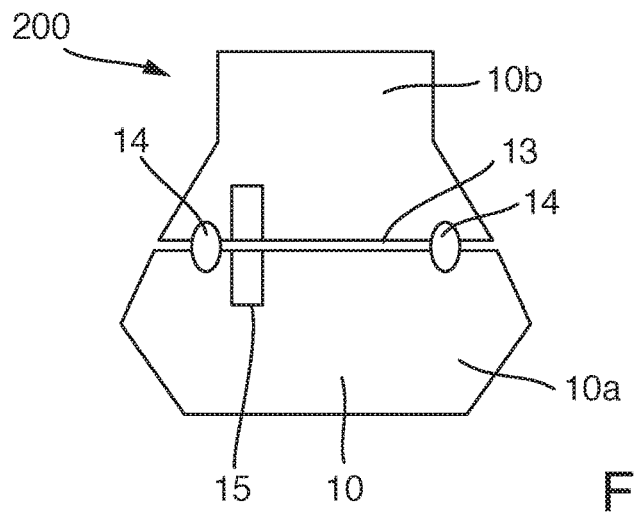
FIGS. 6a to 6c show a LED module according to a further exemplary embodiment which has a two-part leadframe; in this case
Figure 6B:
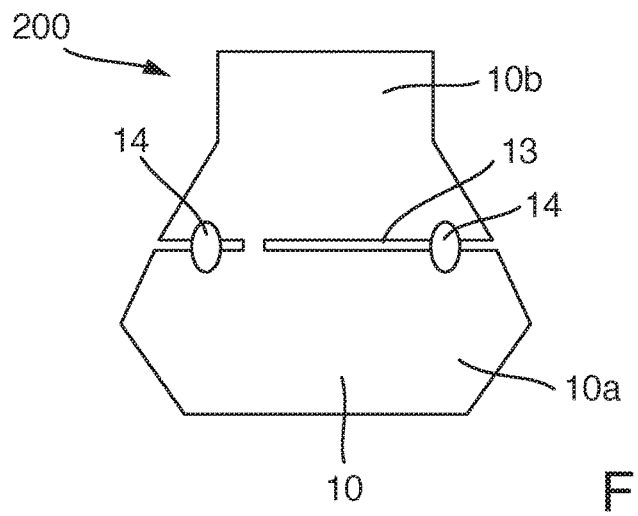
Figure 6C:
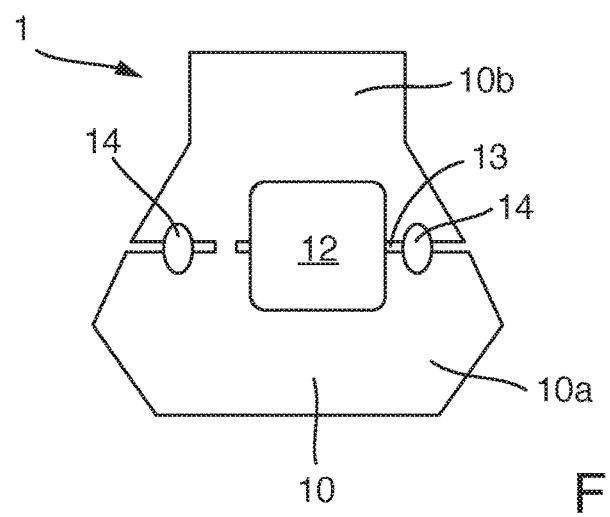

FIGS. 6a to 6c show a group of further exemplary embodiments, which are directed to a LED module 1 having one single LED 12, for instance for use in single-spot lights. The leadframe 10 is divided into two, with a gap 13 between the two leadframe sections 10a and 10b. In this case FIG. 6a shows a semi-finished product 200, in which the two leadframe sections 10a and 10b are connected to one another by stabilizing sections 14. At the same time the stabilizing sections 14 reliably space the two leadframe sections 10a and 10b apart from one another. Furthermore, in FIG. 6a two contact sections 15 are shown which are configured for connection to a SMD component, for example a simple connector or a spring contact. In this case FIG. 6b shows a semi-finished product 200, in which the two leadframe sections 10a and 10b can also be connected to one another by a connection bar 201 (see FIG. 8a or FIG. 8b). FIG. 6c shows the LED module 1 after the leadframe 10 of the semi-finished product 200 is equipped with a LED 12.

Figure 7A:
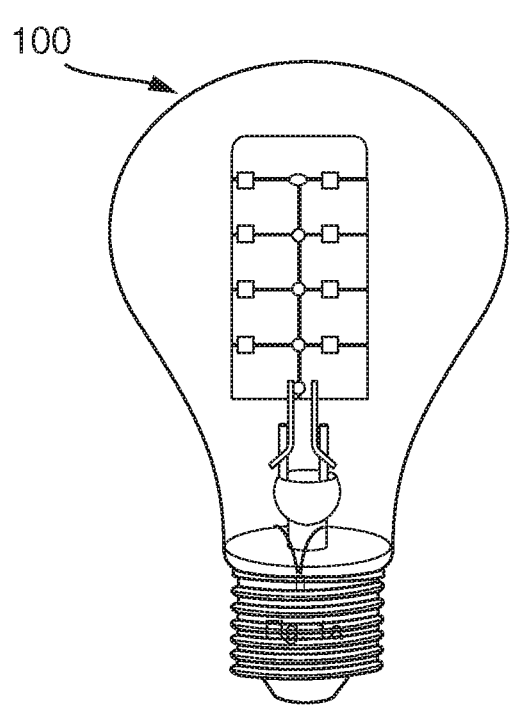
FIGS. 7a to 7c show possible applications of LED modules according to different exemplary embodiments in a LED light.
Figure 7B:
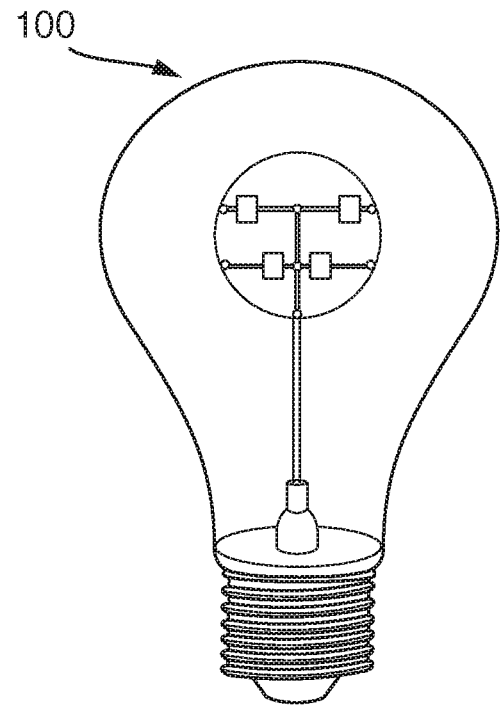
Figure 7C:
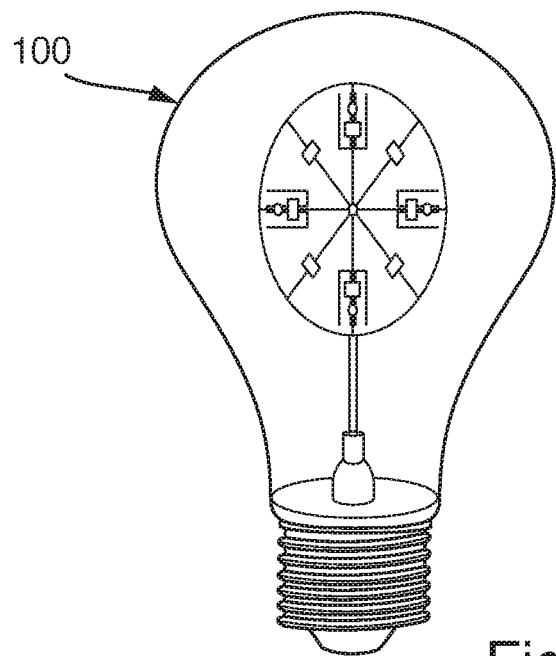

FIGS. 7a to 7c show exemplary applications of the LED modules 1 described above for a LED light 100, which has the external form of a conventional light bulb with an Edison base. Generally speaking, the LED light 100 can be a so-called LED retrofit lamp which is designed for use in conventional sockets. For this purpose, the LED light 100 preferably has a LED driver (not illustrated) which converts the mains voltage provided by the socket into an appropriate form for the LEDs 12.

It may be pointed out that the LED module 1 can be used in various ways, for example in tubular lamps which are designed for fluorescent tube bases, LED reflector lamps, LED strips, LED light filaments, surface light panels, spotlights, floodlights, linear lights, high-bays, torches, wall and/or ceiling lights etc. In particular in the case of LED lights with large LED printed circuit boards the described leadframe design can be used advantageously.

Figure 8A:
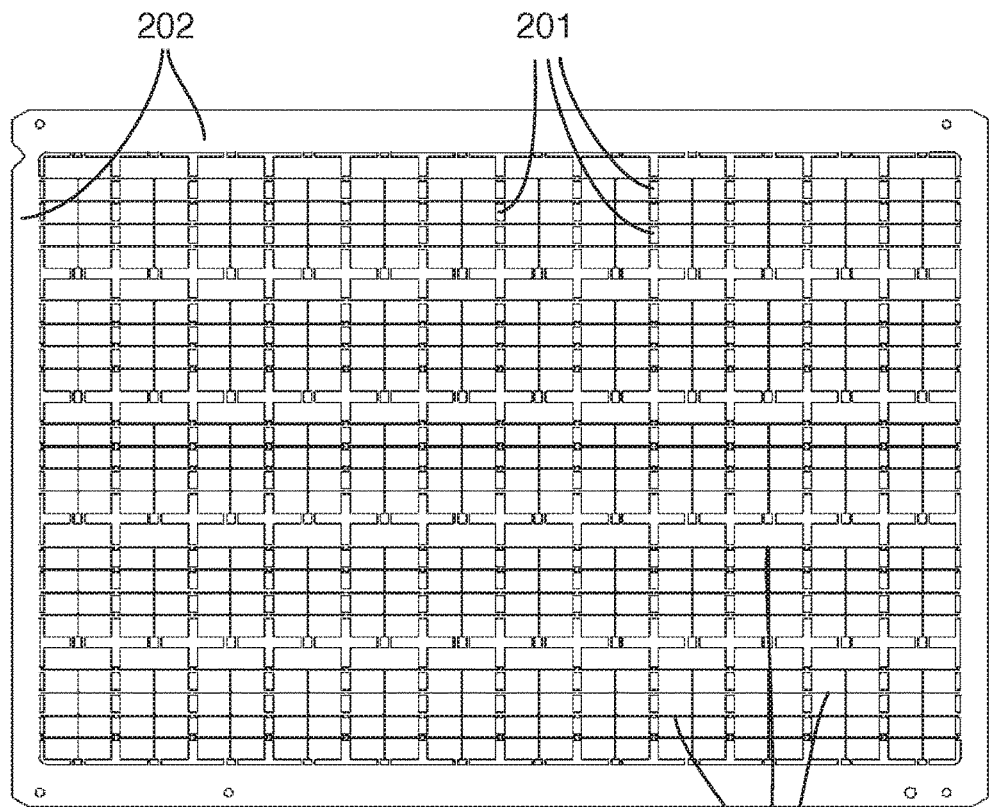
FIGS. 8a, 8b and 8c show semi-finished products for the manufacture of LED modules.
Figure 8B:
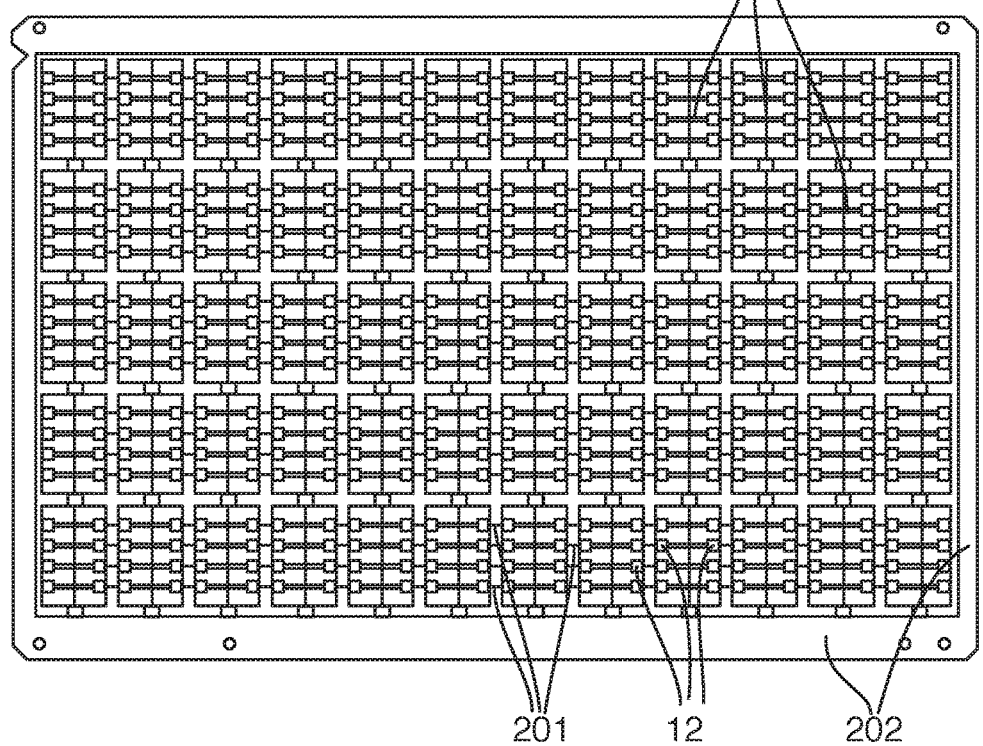

For the production of the LED module 1, according to an exemplary embodiment first of all a plurality of leadframes 10 are stamped out or cut out of a conductive sheet, as shown in FIG. 8a, optionally retaining connection bars 201 and/or transport sections 202, which temporarily mechanically stabilize the semi-finished product 200 for transport and further processing and remove them at a later time. Moreover, the leadframes 10 can be prepared from pre-assembled perforated and/or slotted sheets, in order to save cutting time during the individual cutting out. Furthermore, the surface of the leadframe 10 can be roughened and/or coated. If as a result the heat emission factor of the leadframe 10 is increased, this leads to a temperature drop on the LEDs 12. Moreover, the light yield can be increased by a coating. In a further manufacturing step, the one stabilizing section or the plurality of stabilizing sections 14 are introduced or attached, since an insulating material (for example polymer and/or glass and/or ceramic) is introduced at least partially into intermediate spaces 13 of the leadframe 10, for example injected. In a manufacturing step which can be carried out previously, simultaneously or subsequently, the LEDs 12 are fastened on the leadframe 10, so that a semi-finished product 200 is produced from a plurality of leadframes 10 which are equipped and connected to one another, which is shown schematically in FIG. 8b. Equipping the leadframe 10 with the LEDs 12 can take place by means of a SMD process. Thus the leadframes 10 can be provided at the corresponding points with a soldering paste, then equipped with the LEDs 12 and heated, so that the soldering paste melts and joins the leadframe 10 and the connectors of the LEDs 12. The connection and the fastening of the LEDs 12 can also take place in a technically different manner. Moreover, solder points can be created for mechanical stabilization and/or electrical connection of leadframe sections. Furthermore, in a further manufacturing step, connectors 11 are soldered to the leadframe 10 if they are not already formed integrally or in one piece as components of the leadframe 10. The above-mentioned connection bars 201 and/or transport sections 202, if present, are removed. In a further manufacturing step, if applicable, the LED modules 1 can be brought into the required three-dimensional shape by bending.

Figure 8C:
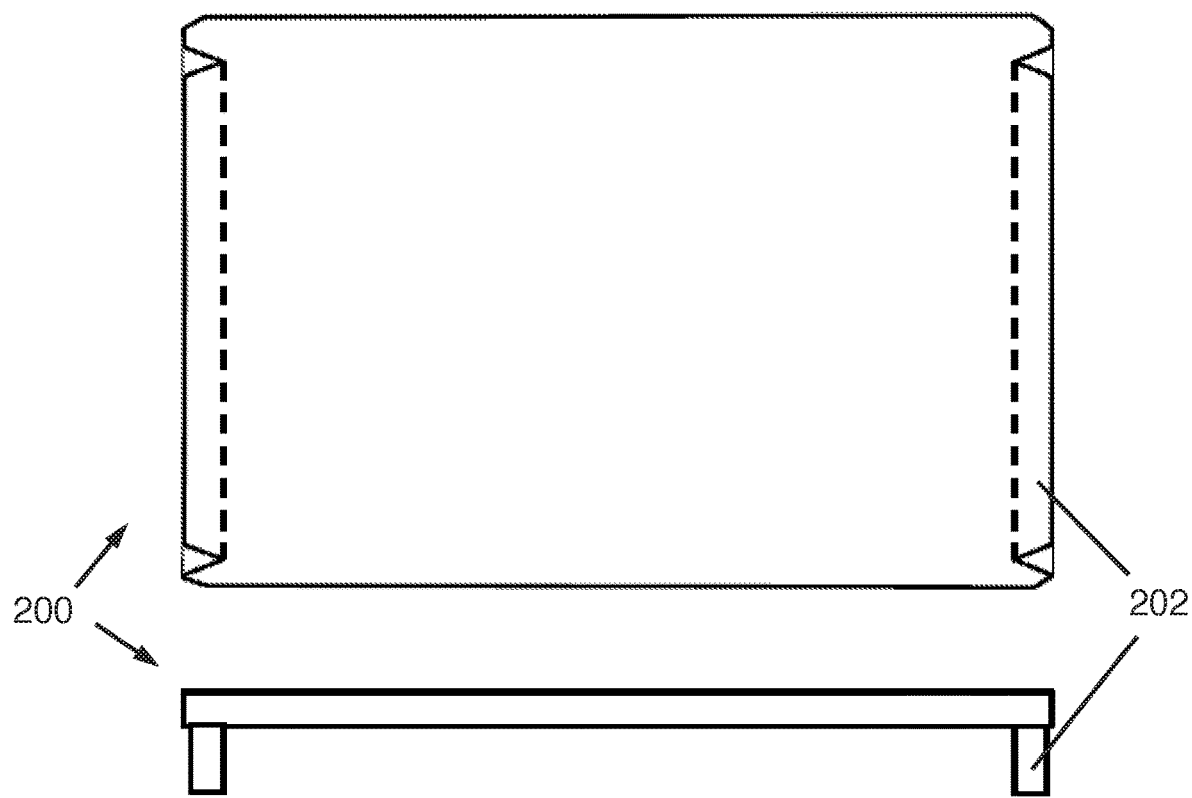

In order to ensure a high mechanical stability of the leadframe semi-finished product during the SMD assembly process, the transport sections 202 or parts thereof can be provided with a U-, V-, W- and/or L-shaped structure. This is shown by way of example by FIG. 8c. In this case the transverse direction of the sheet unwound from the roll is preferably bent. If in this case the transport sections 202 are only profiled or bent downwards, any doctor blade process (application of SMD soldering paste) is not hampered. This stabilization measure significantly increases the rigidity of the sheets in the production process and contributes to the possibility of using thinner sheets, for example <0.6 mm thick. The transport sections 202 are preferably planar at least on the long edges, for example with a width of approximately 10 mm, in order to simplify the transport process. During separation of the leadframe semi-finished products out of the sheet roll, a U-, V-, W- and/or L-shaped profiling of the transport sections 202 is preferably already made for stabilization.

In the exemplary embodiments set out above, the LEDs 12 are connected in series by the leadframe 10. However, different geometries, i.e. circuits and three-dimensional arrangements of the LEDs 12, can be implemented. By way of example reference may be made to the leadframe geometries of FIGS. 9a to 9h.

Figure 9A:
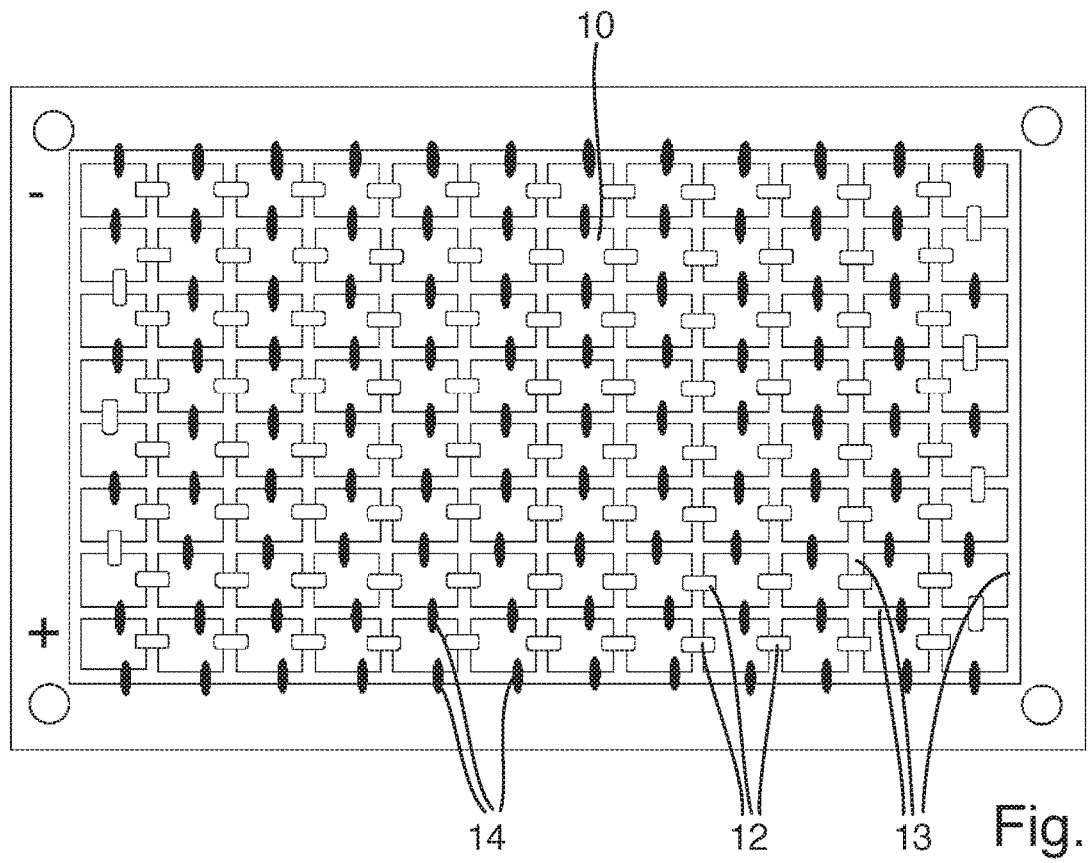
Figure 9B:
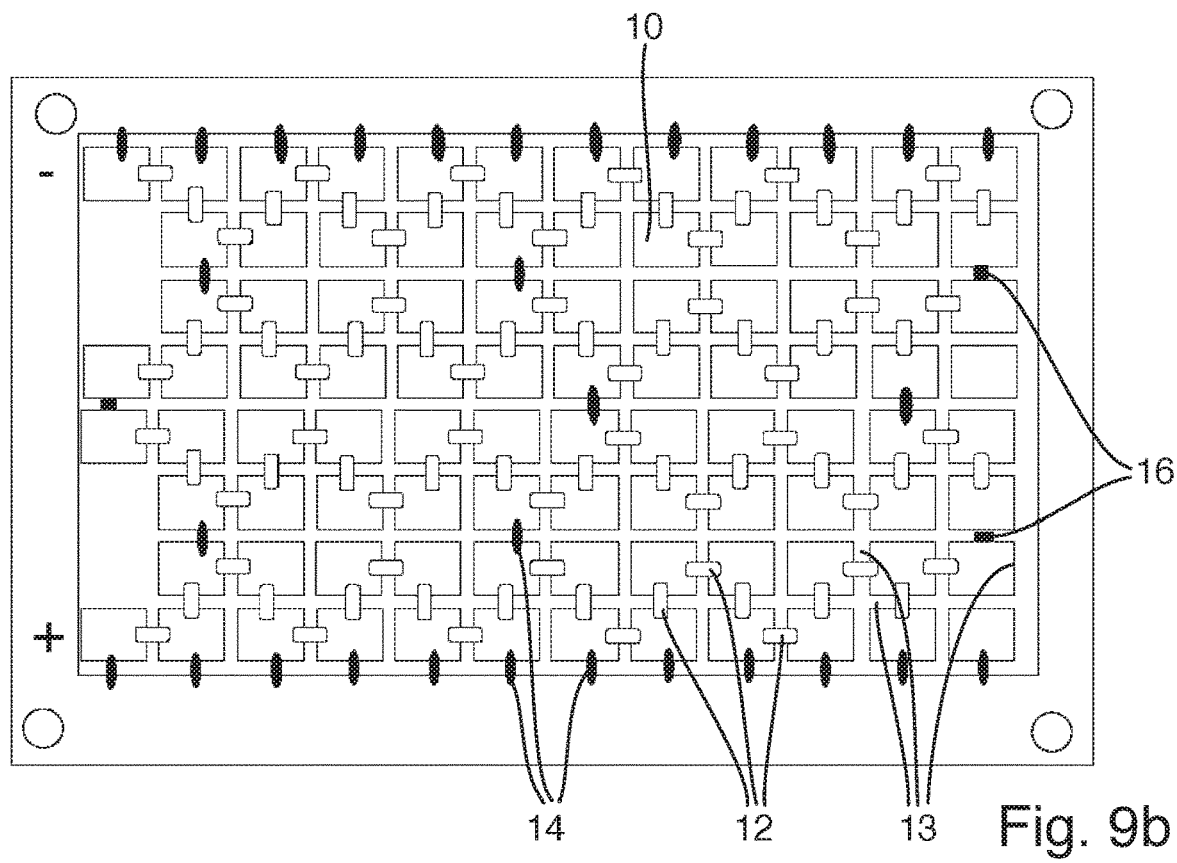

FIG. 9a shows a flat lattice arrangement of series-connected LEDs 12 on a leadframe 10. The stabilizing sections 14 reliably ensure the mechanical stability and electrical functionality of the LED module 1. FIG. 9b shows a geometry in which the LEDs 12 are likewise series-connected and arranged like a lattice, but functions with few stabilization points 14. As a result, the LED module 1 of FIG. 9b can be bent particularly flexibly, so that it is suitable for special light forms, such as for instance omnidirectionally emitting lights. According to this exemplary embodiment the electrical contact between sections of the leadframe 10 is implemented partially by contact sections 16 which for example can be produced by soldering. After the bending the three-dimensional form of the leadframe 10 can be fixed for example by further stabilizing sections 14. A partial parallel connection of LEDs 12 is disclosed in the exemplary embodiment of FIG. 9c, in order to show that the described concept of the reinforced leadframe 10 is not limited to series-connected LEDs 12. FIGS. 9d to 9f show exemplary embodiments of a strip-shaped stabilized leadframe 10 with stabilizing sections 14 attached in various ways. In this case the LEDs 12 are series-connected. A strip-shaped stabilized leadframe 10 with parallel connected LEDs 12 is disclosed by FIG. 9g. A mixture of parallel connected and series connected LEDs 12 is disclosed by FIG. 9h.

If applicable, all individual features which are set out in the exemplary embodiments can be combined with one another and/or exchanged for one another, without departing from the scope of the invention.

LIST OF REFERENCES

1 LED module
10 leadframe
10' leadframe section
10a leadframe section
10b leadframe section
11 connection
12 LED
13 intermediate space/gap
14 stabilizing section
15 contacting section
16 contact section
100 LED light
200 semi-finished product
201 connecting piece
202 transport section

The invention claimed is:

1. A light-emitting diode (LED module for use in a LED light, the LED module comprising:
a leadframe having a plurality of sections, wherein the plurality of sections define intermediate spaces in the leadframe;
a plurality of LEDs that are electrically and mechanically connected to the leadframe; and
a plurality of stabilizing sections which are physically separate and individually distinguishable from one another and made from an insulating material, wherein the plurality of stabilizing sections is introduced locally into the intermediate spaces of the leadframe, and wherein the plurality of stabilizing sections fastens the plurality of sections of the leadframe to one another.

2. The LED module according to claim 1, wherein the plurality of stabilizing sections is introduced locally in a punctiform manner.

3. The LED module according to claim 1, wherein the insulating material is at least one material selected from the group consisting of a polymer, a glass, a ceramic, and a surface-mounted device (SMD) component with insulating properties.

4. The LED module according to claim 1, wherein at least one surface of the leadframe substantially has no contact with the insulating material of the plurality of stabilizing sections.

5. The LED module according to claim 4, wherein the at least one surface of the leadframe is substantially uncovered.

6. The LED module according to claim 1, wherein the intermediate spaces of the leadframe are electrically insulating and are not filled, in that the intermediate spaces completely penetrate the leadframe in a direction of a thickness of the leadframe.

7. The LED module according to claim 1, wherein the leadframe is at least partially bent.

8. The LED module according to claim 7, wherein two of the sections of the plurality of sections of the leadframe are bent towards one another, wherein the two of the sections are spaced apart and connected by the plurality of the stabilizing sections.

9. The LED module according to claim 1, wherein the leadframe is equipped with LEDs on a first side of the leadframe and on an opposing second side of the leadframe.

10. The LED module according to claim 1, wherein the LEDs are arranged in at least one manner selected from the group consisting of lattice-like, linear, and circular.

11. The LED module according to claim 1, wherein the LEDs are:
connected by the leadframe in series; or
connected by the leadframe in a combination of series and parallel connections.

12. A method for producing the LED module according to claim 1, the method comprising:
producing the leadframe from a sheet using a process selected from the group consisting of stamping, cutting, and etching;
equipping the leadframe with the LEDs by connecting the LEDs electrically and mechanically to the leadframe; and
stabilizing the leadframe by local introduction of the insulating material into the intermediate spaces of the leadframe so that the stabilizing sections are formed.

13. The method according to claim 12, wherein producing the leadframe involves keeping connection bars and transport sections attached to the leadframe, wherein the connection bars and transport sections are not part of a finished form of the LED module.

14. The method according to claim 12, wherein the insulating material is at least one material selected from the group consisting of a polymer, a glass, a ceramic, a cement, and an insulating surface-mounted device (SMD) component with insulating properties.

15. The method according to claim 12, wherein the leadframe is not encapsulated, partially or completely, by a substrate material.

16. The method according to claim 12, further comprising roughening at least one surface of the leadframe.

17. The method according to claim 12, further comprising coating at least one surface of the leadframe with a material selected from the group consisting of tin (Sn), gold (Au), silver (Ag), platinum (Pt), palladium (Pd), zinc (Zn), and nickel (Ni).

18. The method according to claim 12, further comprising finishing at least one surface of the leadframe with at least one finish selected from the group consisting of a light-reflecting coating, an engraving, a laser engraving, and a photochemical etched structure.

19. The method according to claim 12, further comprising bending the leadframe.

20. The LED module according to claim 1, wherein the plurality of stabilizing sections is introduced locally in a linear manner.

21. The LED module according to claim 1, wherein the plurality of stabilizing sections does not overlap to form a structure on an order of magnitude of the leadframe.

* * * * *